(12) United States Patent
Lu

(10) Patent No.: US 8,104,851 B2
(45) Date of Patent: Jan. 31, 2012

(54) SLIDING TRACK FOR ELECTRONIC DEVICES

(75) Inventor: Limo Lu, Taipei Hsien (TW)

(73) Assignee: Broadrack Technology Corp., New Taipei (TW)

( * ) Notice: Subject to any disclaimer, the term of this patent is extended or adjusted under 35 U.S.C. 154(b) by 951 days.

(21) Appl. No.: 12/108,522

(22) Filed: Apr. 24, 2008

(65) Prior Publication Data

US 2009/0267471 A1    Oct. 29, 2009

(51) Int. Cl.
*A47B 88/00* (2006.01)
(52) U.S. Cl. .................................................. 312/334.5
(58) Field of Classification Search ............... 312/334.1, 312/334.4, 334.5, 334.7, 334.8, 223.1, 334.44–334.47, 312/333; 211/26; 248/205.1
See application file for complete search history.

(56) References Cited

U.S. PATENT DOCUMENTS

| | | | | |
|---|---|---|---|---|
| 3,133,768 A * | 5/1964 | Klakovich | | 384/17 |
| 5,046,861 A * | 9/1991 | Tarver | | 384/20 |
| 5,833,337 A * | 11/1998 | Kofstad | | 312/334.5 |
| 6,442,031 B1 * | 8/2002 | Liu | | 361/727 |
| 6,578,939 B1 * | 6/2003 | Mayer | | 312/334.5 |
| 6,659,577 B2 * | 12/2003 | Lauchner | | 312/334.5 |
| 6,736,277 B2 * | 5/2004 | Lauchner et al. | | 211/26 |
| 6,811,039 B2 * | 11/2004 | Chen et al. | | 211/26 |
| 2003/0106863 A1 * | 6/2003 | Lauchner et al. | | 211/26 |
| 2003/0205539 A1 * | 11/2003 | Lauchner et al. | | 211/26 |
| 2005/0052102 A1 * | 3/2005 | Lauchner | | 312/334.5 |
| 2008/0036347 A1 * | 2/2008 | Liang | | 312/334.5 |
| 2009/0219701 A1 * | 9/2009 | Wu et al. | | 361/727 |

* cited by examiner

*Primary Examiner* — Darnell Jayne
*Assistant Examiner* — Timothy M Ayres

(57) ABSTRACT

A sliding track assembly for a casing for installing an embedding object so that the embedding object can be pulled out or pushed thereto comprises a retaining unit having a front end and a rear end; each of the front end and the rear end having a plurality of through holes for locking the retaining unit to a casing; a base having a wall with a plurality of through holes; a sliding sleeve engaged to and slideable to the base; the sliding sleeve having a long hole; a supporting frame installed at an inner side of the sliding sleeve and having an ear; the ear having a plurality of retaining holes and a sliding groove corresponding to the long hole of the sliding sleeve; and a clamping unit installed at an outer side of the sliding sleeve.

2 Claims, 12 Drawing Sheets

US 8,104,851 B2

SLIDING TRACK FOR ELECTRONIC DEVICES

FIELD OF THE INVENTION

The present invention relates to sliding tracks, and particular to a stageless sliding track of an electronic device which is especially used to slot arrays of an industrial computer.

BACKGROUND OF THE INVENTION

The sliding tracks for industrial computer casing have been developed for a long time. In one prior art, a track has a rear support frame and a front supporting frame which is received in the rear supporting frame. Each supporting frame has a retaining portion at the ends far away from another supporting frame. A positioning unit passes through a first and a second retaining portion so as to be fixed to one end of a casing of a server. The front and rear supporting frames are installed with a first and a second connecting portion so as to adjust the whole length of the whole structure. Thus the tracks of the server casing can be assembled with objects of different sizes.

Furthermore in another prior art, two sliding bodies are disclosed. One body has a sliding space for assembling another body. One end of each body is assembled with a connecting portion which can be assembled into a casing. An extension portion of one body is assembled to a casing of different size which has a design like above mentioned structure.

However, above mentioned prior arts have complicated structures and are difficult in adjustment.

SUMMARY OF THE INVENTION

Accordingly, the object of the present invention is to provide a sliding track suitable for various specifications and the sliding tracks serve to install some computer peripherals, such as computer keyboards, displays, etc. The distance between the two sliding tracks are adjustable to a desired one.

Another object of the present invention is to provide a sliding track assembly, wherein the structure is simple, concrete and has a lower cost. It can be installed to the mainframe of the casing. The locking and positioning can be positioned rapidly.

To achieve above object, the present invention provides a sliding track assembly for a casing for installing an embedding object so that the embedding object can be pulled out or pushed thereto; comprising: a retaining unit having a front end and a rear end; each of the front end and the rear end having a plurality of through holes for locking the retaining unit to a casing; a base having a wall with a plurality of through holes; a sliding sleeve engaged to and slidable to the base; by a rear end thereof to lock to a machine frame; the sliding sleeve having a long hole; a supporting frame installed at an inner side of the sliding sleeve and having an ear; the ear having a plurality of retaining holes and a sliding groove 186 corresponding to the long hole of the sliding sleeve; and a clamping unit installed at an outer side of the sliding sleeve; a wall of the clamping unit having a plurality of through holes corresponding to the supporting frame and the base of the sliding track; the clamping unit being combined to the supporting frame through screws; an inner track inserted into the sliding track from the front end thereof. The supporting frame is shortened and the clamping unit is also shortened; the clamping unit is fixed to the supporting frame by screws so as to have smaller gap between two sliding tracks.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
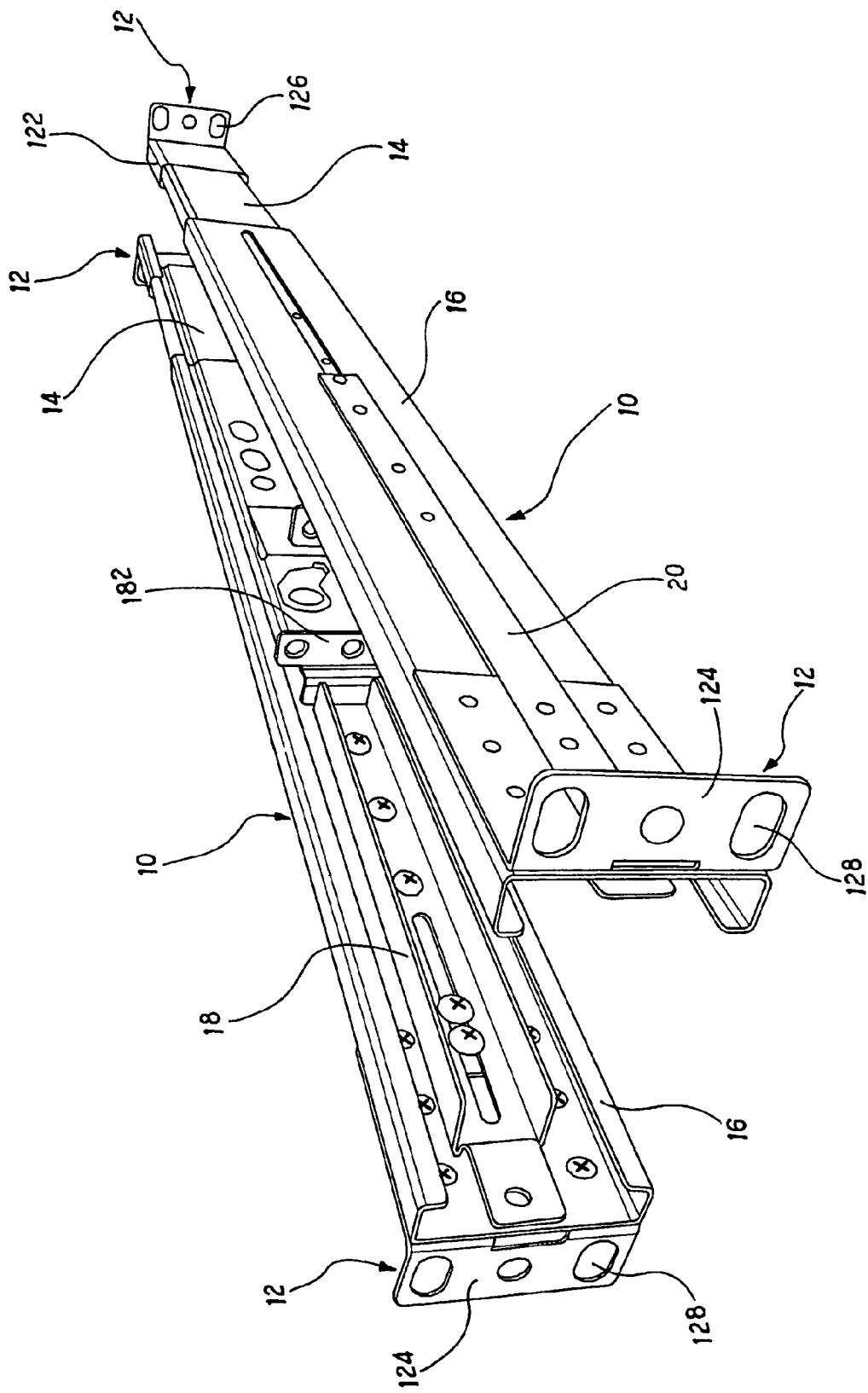
FIG. 1 is a perspective view showing two sliding tracks of the present invention.
Figure 2:
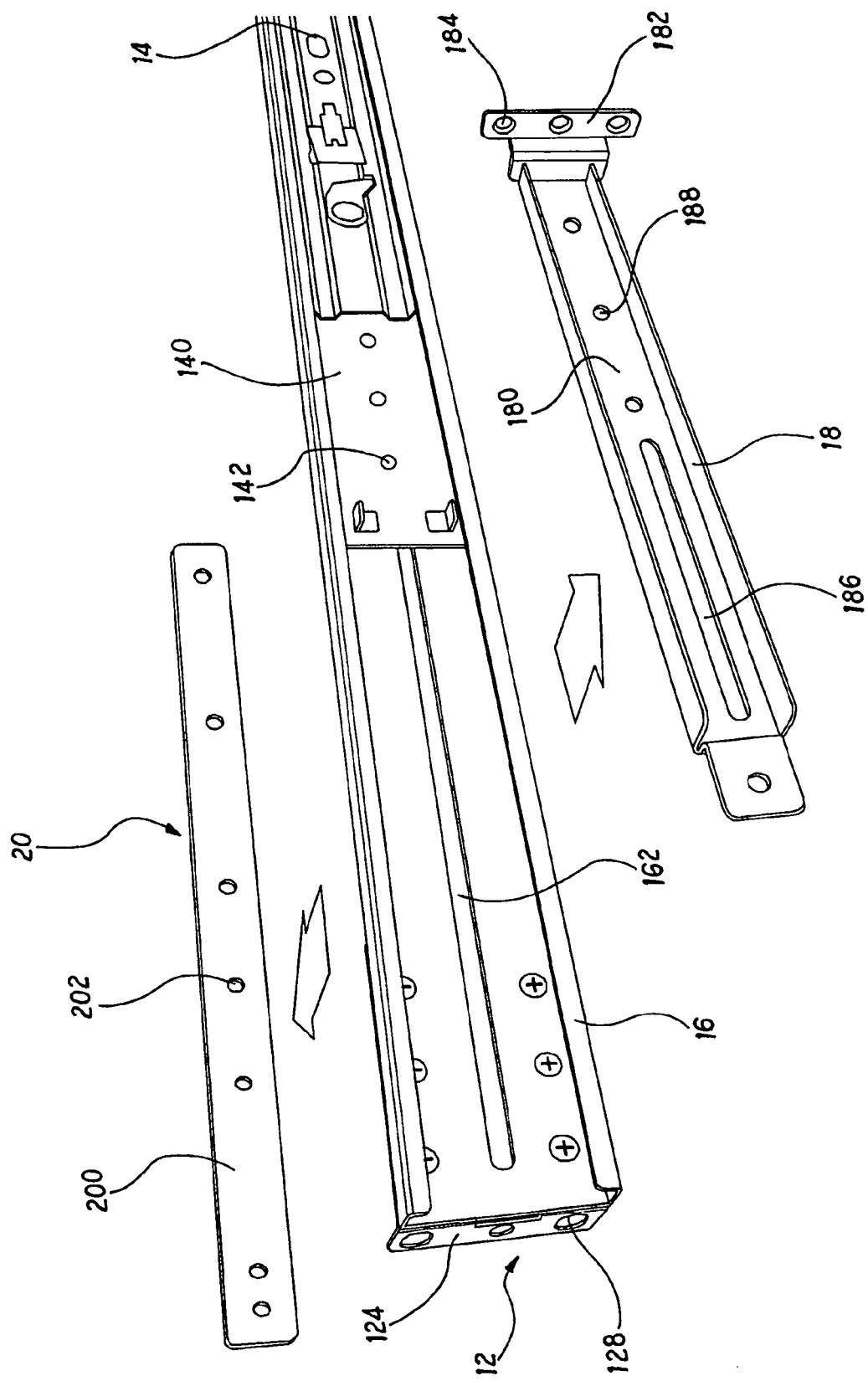
FIG. 2 is an exploded view showing one sliding track of the present invention.

Referring to FIGS. 1 and 2, two sliding tracks 10 of the present invention are symmetrically arranged for receiving an object from a fixed direction, which can be pulled out or pushed thereto. Each sliding track 10 has the following elements.

Each sliding track 10 has a retaining unit 12, a base 14, a sliding sleeve 16, a supporting frame 18, and a clamping unit 20. The retaining unit 12 has a front end 122 and a rear end 124. The front end 122 has a plurality of penetrating holes 126 for retaining to a front retaining frame 42 by screwing. The rear end 124 has a plurality of penetrating holes 128 so that they can be fixed to the rear retaining frame 42 by screwing. A wall 140 of the base 14 has a plurality of through holes 142 for alignment. The base has a guide recess for receiving an embedding object 40. The sliding sleeve 16 sleeves around and slideable along the base 14. The sliding sleeve 16 can be locked to a retaining frame by a rear end 124. The sliding sleeve 16 has a long hole 162. The supporting frame 18 is installed at an inner side of the sliding sleeve 16. The supporting frame 18 has an ear 182. The ear 182 has a plurality of retaining holes 184 for locking. The supporting frame 18 is formed with a sliding groove 186 corresponding to the long hole 162 of the sliding sleeve 16. A wall 180 of the supporting frame 18 has a plurality of through holes 188 for alignment. The clamping unit 20 is installed at an outer side of the sliding sleeve 16. The wall 200 of the clamping unit 20 has a plurality of through holes 202 corresponding to the supporting frame 18 and the base 14. By screws, the supporting frame 18 can be locked to the sliding sleeve 16.

Figure 3:
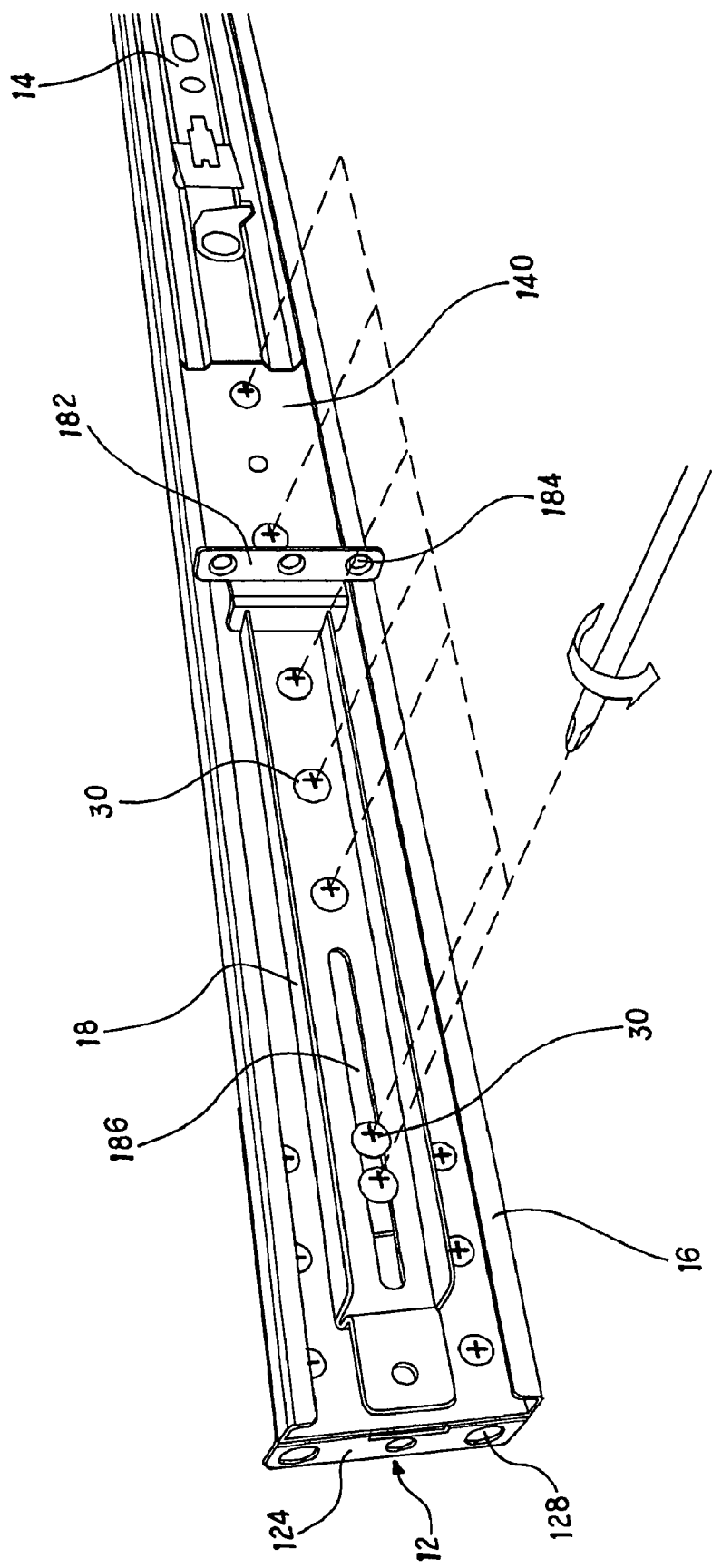
FIG. 3 is an assembled schematic view of a single sliding track of the present invention.
Figure 4:
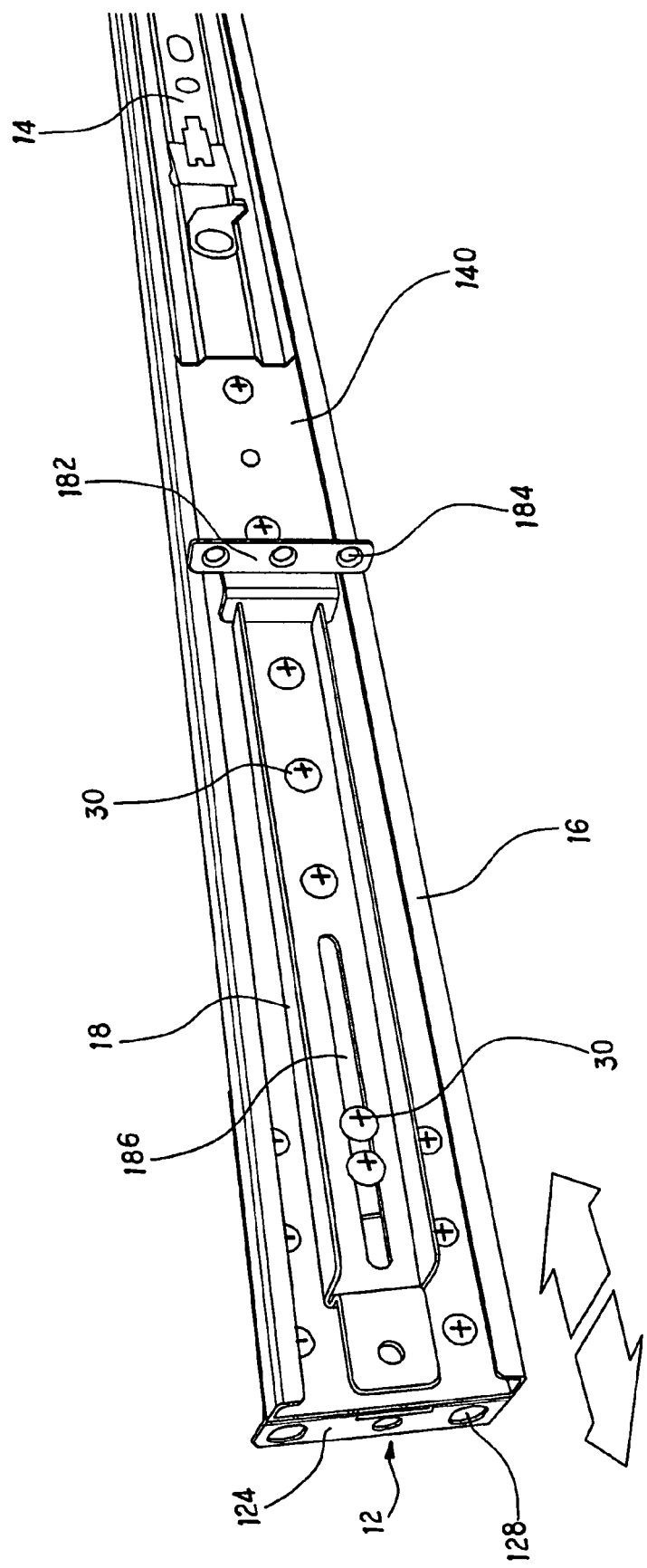
FIG. 4 is a schematic view showing the operation of the sliding track of the present invention.

Referring to FIGS. 3 and 4, screws 30 pass through the sliding groove 186 of the supporting frame 18 and the long hole 162 of the sliding sleeve 16 so that the supporting frame 18 and the clamping unit 20 are locked to the sliding sleeve 16. Thus, the sliding sleeve 16 is moveable along the supporting frame 18 and the clamping unit 20 to be aligned to a retaining frame of a machine casing. Furthermore, in assembly, the user can assure the front and rear ends of the sliding track 10 for operation.

Figure 5:
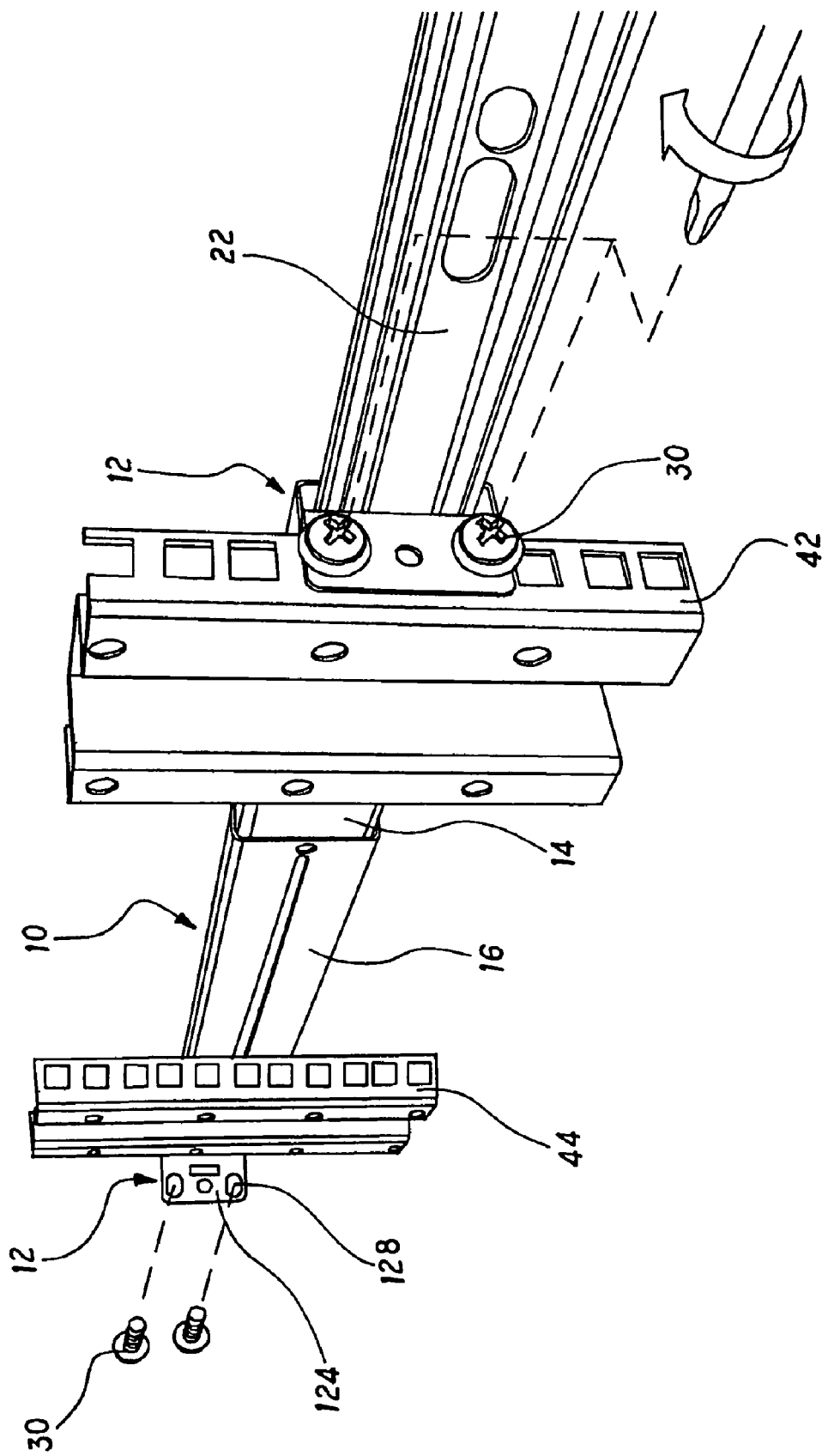
FIG. 5 is a schematic view showing that the sliding track of the present invention is locked to a front retaining frame.
Figure 6:
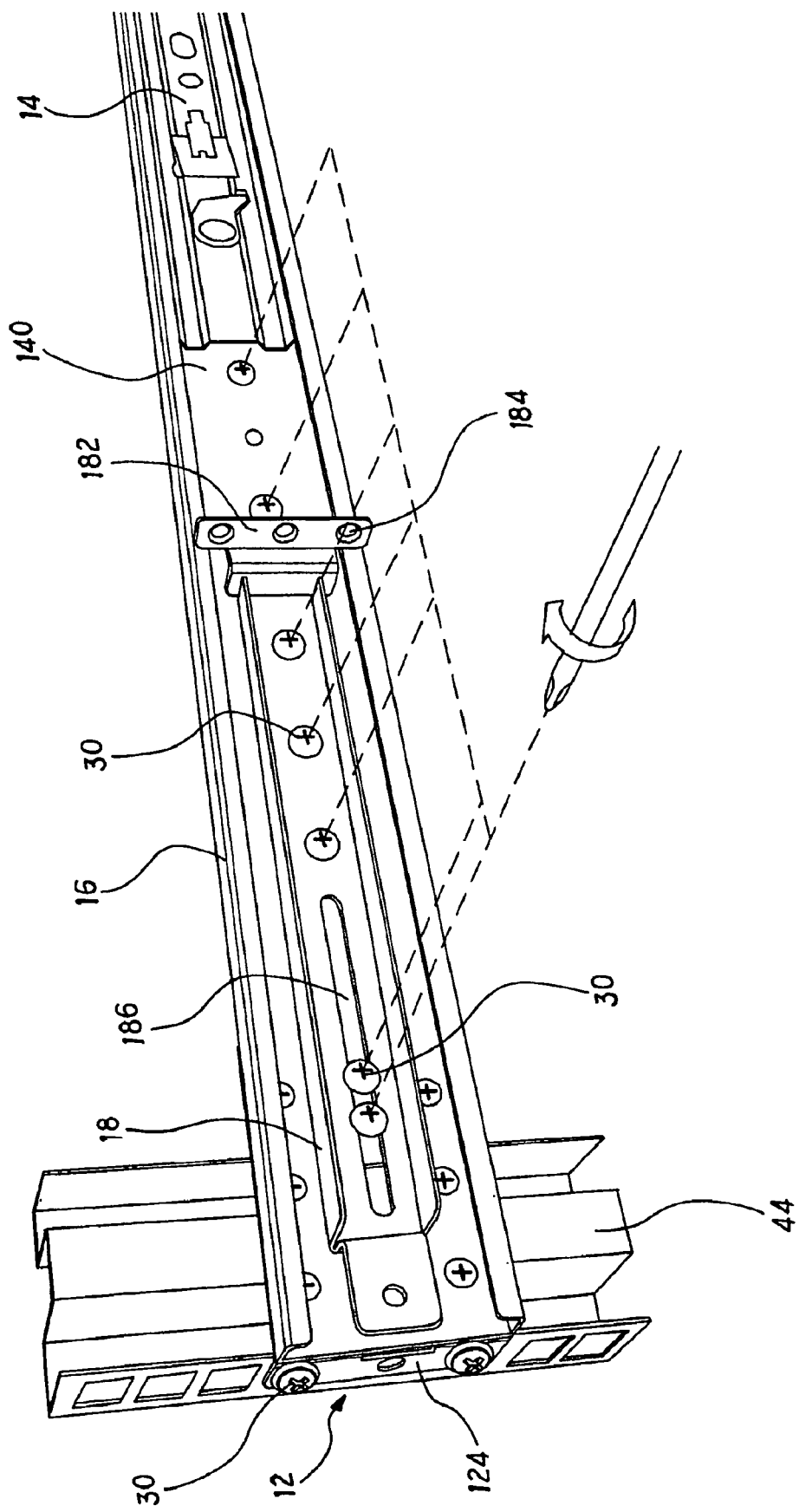
FIG. 6 is a schematic view showing that the sliding track is locked to a rear retaining frame according to the present invention.

Referring to FIG. 5, screws pass through the through holes 126, 128 of the front end 122 and rear end 124 to retain the retaining unit 12 to the front retaining frame 42 and the rear retaining frame 44 so as to assure the moving path of the sliding track 10. Moreover, the two sliding tracks 10 are symmetrical and are in parallel. Referring to FIG. 6, the screws 30 lock the supporting frame 18 and the clamping unit 20 so that the sliding sleeve 16 is fixed and unmovable.

Figure 7:
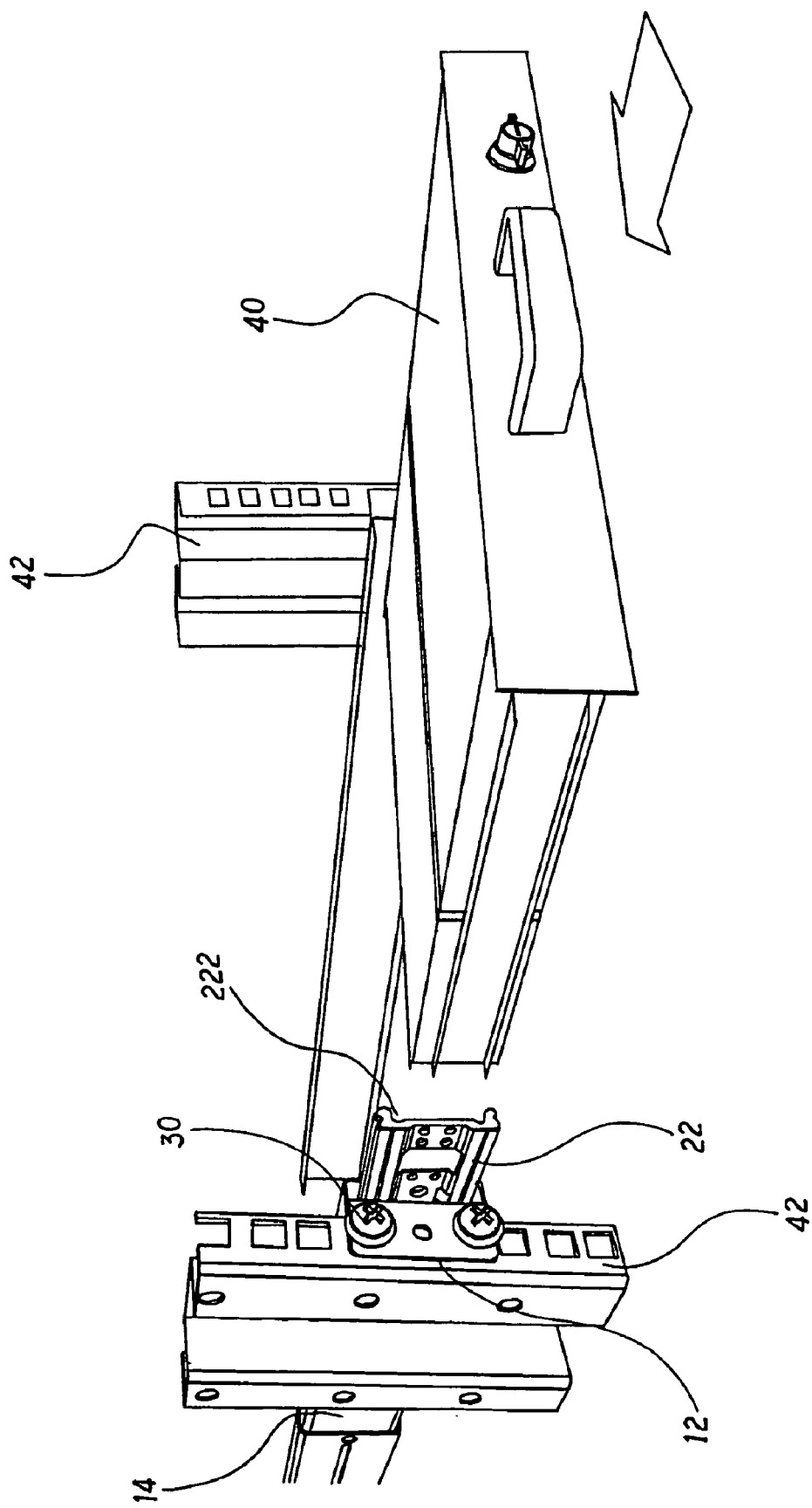
FIG. 7 is a schematic view showing a state that an embedding object is to be engaged to the sliding track.
Figure 8:
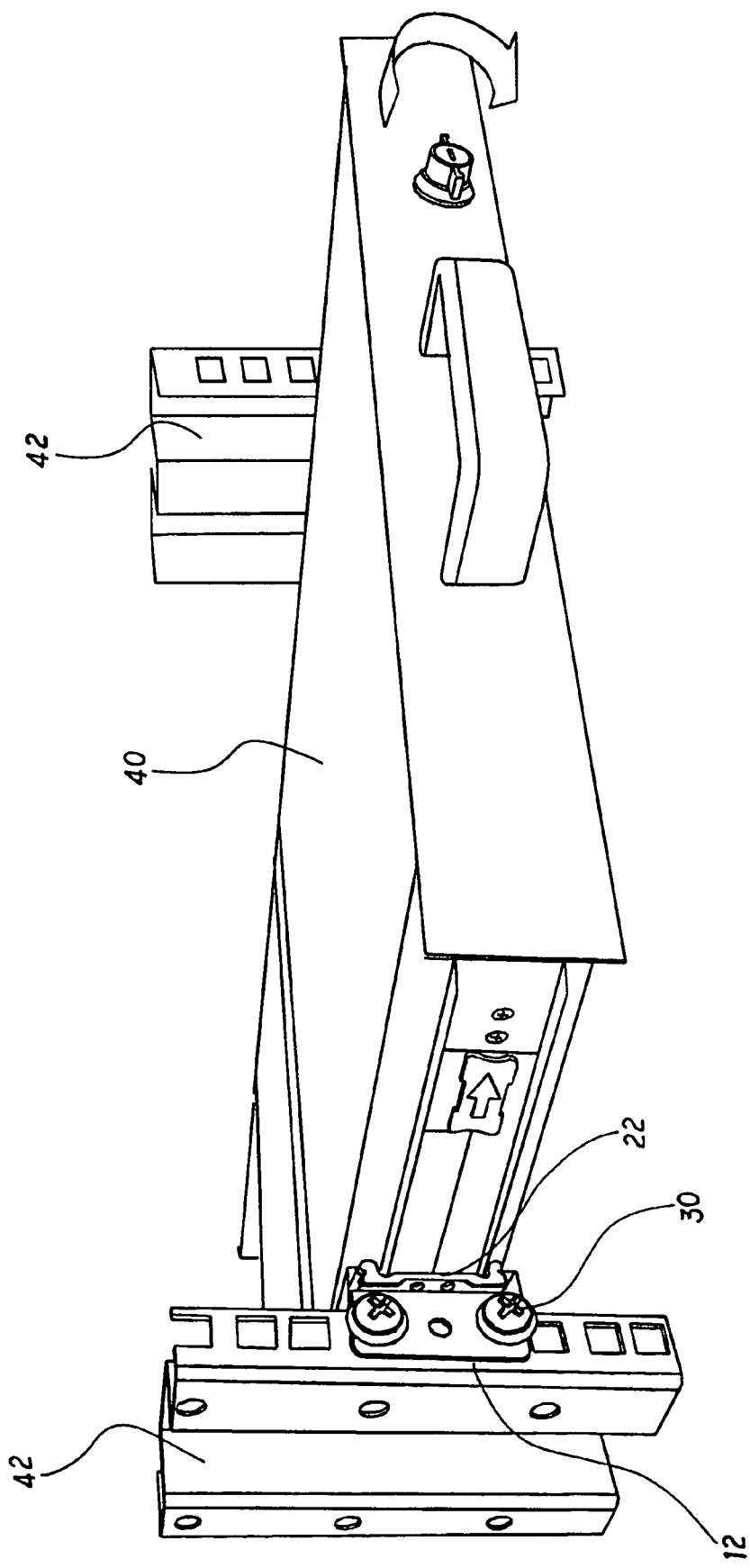
FIG. 8 is a schematic view showing that the embedding object is engaged to the sliding track of the present invention.
Figure 9:
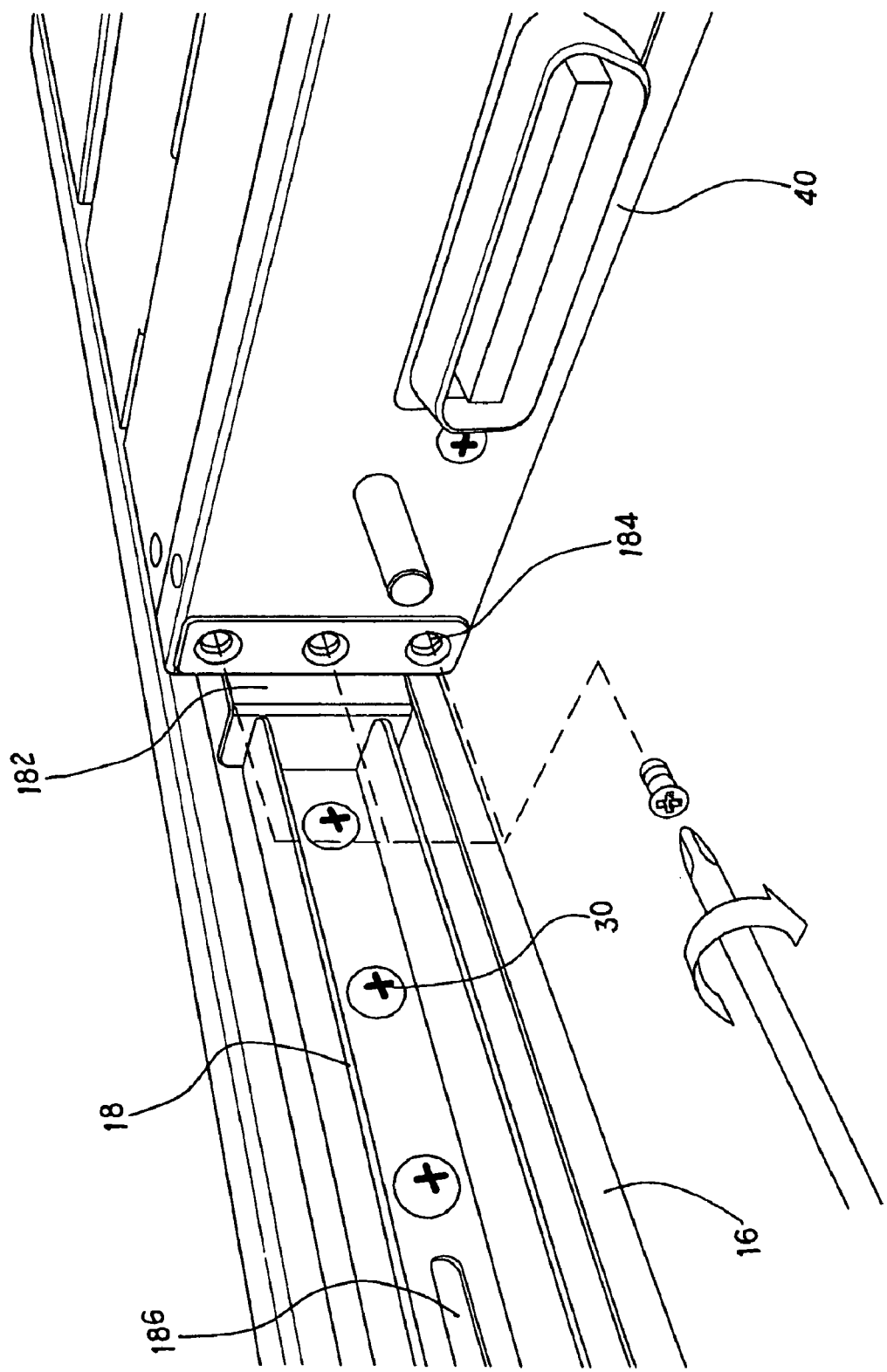
FIG. 9 is an assembled schematic view showing the rear end of the embedding object of the present invention.
Figure 10:
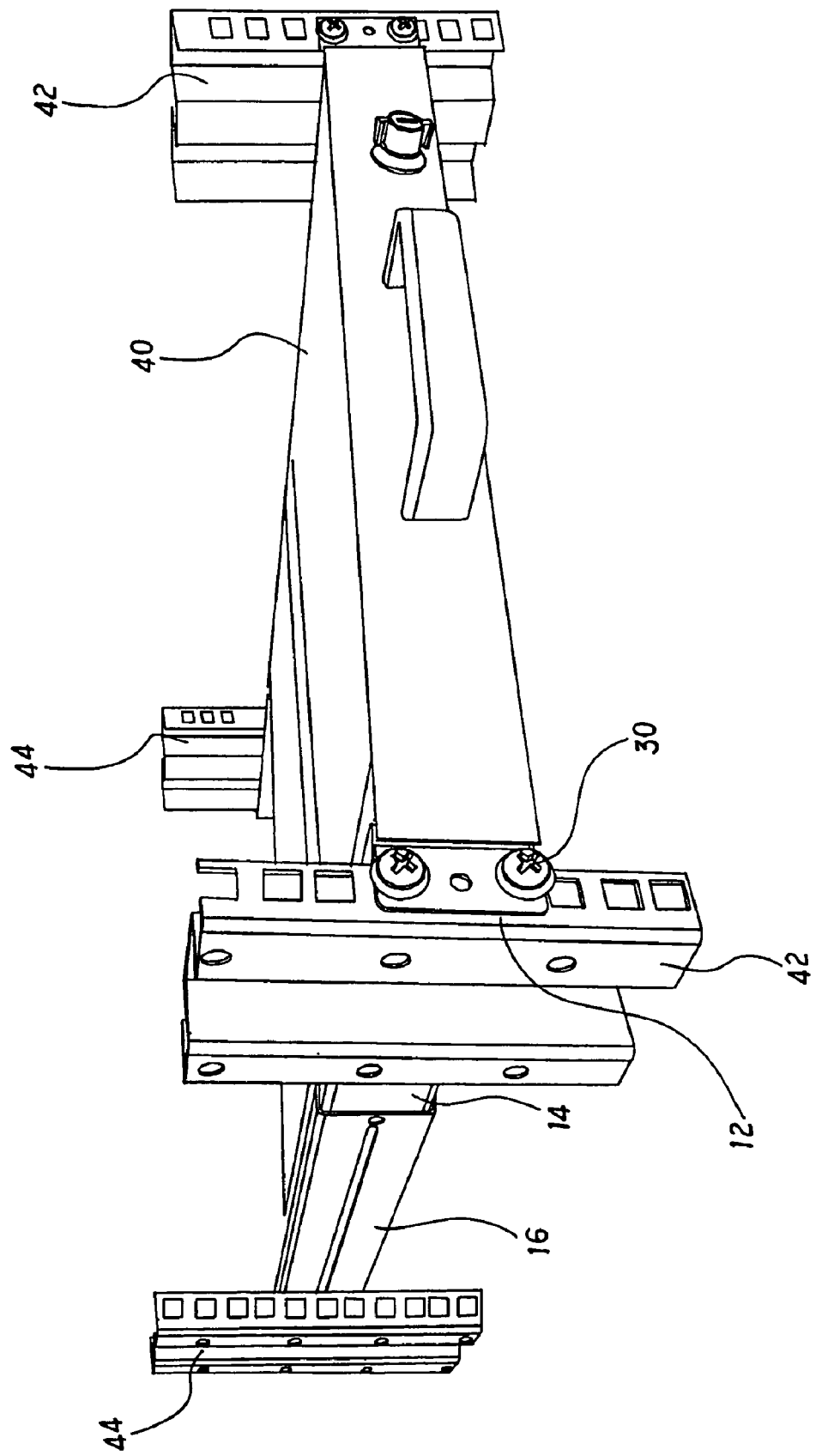
FIG. 10 is an assembled schematic view showing that the embedding object is engaged to the sliding track according to the present invention.

With reference to FIG. 7, after assembly, an inner track 22 inserts into the sliding track 10 from the front end 122. Further, the groove 221 serves to combine with an embedding object 40. The embedding object 40 may be a computer mainframe which can be inserted into an inner surface of the base 14 through the inner track 22. See FIG. 8, it is illustrated that the embedding object 40, such as a computer mainframe, is engaged to the base 14 from the inner track 22.

After engagement, the embedding object 40 has a rear end resisting against the ear 182 of the supporting frame 18. The ear 182 has a plurality of retaining holes 184 for locking the embedding object 40 so that the embedding object 40 can be drawn out or pushed inwards along the base 14.

Above mentioned is only one embodiment of the present invention, the present invention provides a sliding track which matches to various specifications with a larger adjust gap (for example, 614 mm to 828 mm). The sliding track 10 serves to install other peripherals and the distances therebetween is adjustable. The structure is simple, concrete and has a lower cost. It can be installed to the mainframe of the casing. The locking and positioning can be positioned rapidly.

Figure 11:
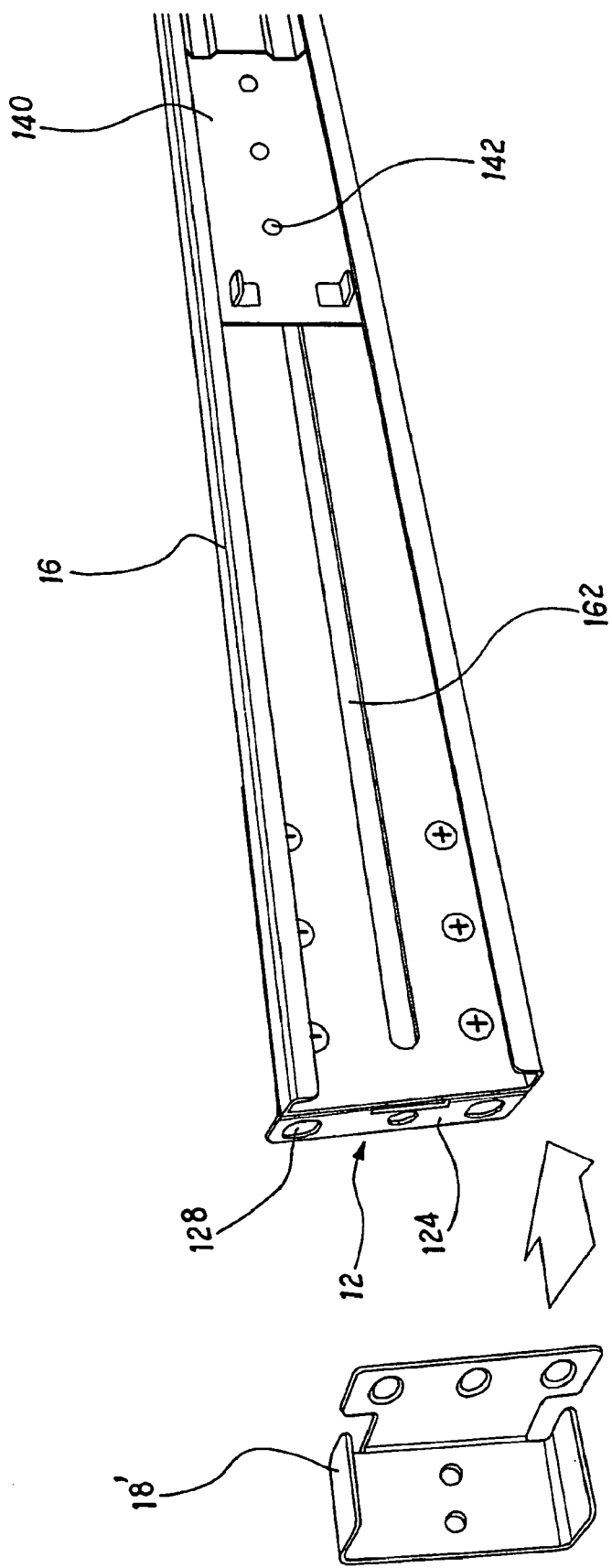
FIG. 11 is an exploded schematic view of another embodiment of the present invention.
Figure 12:
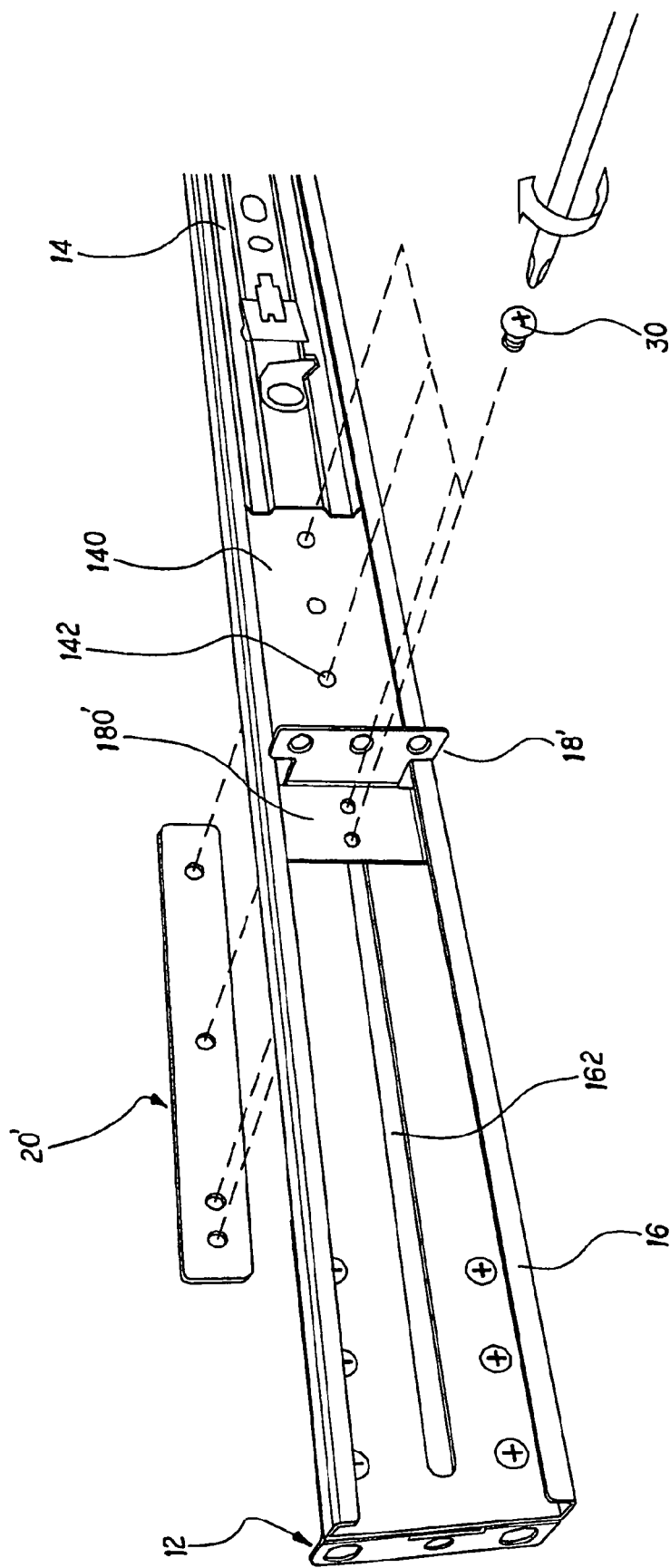
FIG. 12 is a schematic view showing another embodiment of the present invention before assembly.

Referring to FIGS. 11 and 12, another embodiment is illustrated. In that, a wall 180' of the supporting frame 18' is shorter than that of the supporting frame 18 in the former embodiment. The clamping unit 20' is also shortened. Screws 30 serve to fix the structure. The gap is about 504 mm to 614 mm.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A sliding track assembly comprising:
   a retaining unit having a front end and a rear end, each of the front end and the rear end having a plurality of first through holes;
   a base, having a plurality of second through holes, and mounted by the front end of the retaining unit;
   a sliding sleeve, slidably engaged with the base, mounted by the rear end of the retaining unit, and having a long hole;
   a supporting frame, installed at an inner side of the sliding sleeve, and having an ear with a plurality of retaining holes and a sliding groove corresponding to the long hole of the sliding sleeve; and
   a clamping strip, installed at an outer side of the sliding sleeve, and having a plurality of third through holes corresponding to the second through holes of the base, the sliding groove of the supporting frame and the long hole of the sliding sleeve;
   wherein the clamping strip is fastened to the sliding sleeve and the supporting frame by inserting screws into a part of the third through holes, the long hole and the sliding groove and fastened to the base by inserting another screws into the second through holes and another part of the third through holes.

2. The sliding track assembly as claimed in claim 1, further comprising an inner track inserted into the sliding track from the front end thereof.

* * * * *